(12) United States Patent
Yamada et al.

(10) Patent No.: US 8,222,619 B2
(45) Date of Patent: Jul. 17, 2012

(54) MULTI-COLUMN ELECTRON BEAM EXPOSURE APPARATUS AND MULTI-COLUMN ELECTRON BEAM EXPOSURE METHOD

(75) Inventors: Akio Yamada, Tokyo (JP); Hiroshi Yasuda, Tokyo (JP); Mitsuhiro Nakano, Tokyo (JP); Takashi Kiuchi, Tokyo (JP)

(73) Assignee: Advantest Corp., Tokyo (JP)

( * ) Notice: Subject to any disclaimer, the term of this patent is extended or adjusted under 35 U.S.C. 154(b) by 283 days.

(21) Appl. No.: 12/586,717

(22) Filed: Sep. 25, 2009

(65) Prior Publication Data
US 2010/0019172 A1    Jan. 28, 2010

Related U.S. Application Data

(63) Continuation of application No. PCT/JP2007/056246, filed on Mar. 26, 2007.

(51) Int. Cl.
*A61N 5/00*    (2006.01)
*G21G 5/00*    (2006.01)

(52) U.S. Cl. .................................................. 250/492.2

(58) Field of Classification Search ............... 250/492.2, 250/492.1, 492.22, 492.3
See application file for complete search history.

(56) References Cited

U.S. PATENT DOCUMENTS 6,667,486 B2 * 12/2003 Ohta et al. ............... 250/492.22
2008/0049204 A1 * 2/2008 Yabara et al. ................... 355/53

FOREIGN PATENT DOCUMENTS

| JP | 61-283121 | 12/1986 |
|---|---|---|
| JP | 08-191042 | 7/1996 |
| JP | 11-329322 | 11/1999 |
| JP | 2001-203777 | 7/2001 |
| JP | 2004-88071 | 3/2004 |
| JP | 2006-278492 | 10/2006 |

OTHER PUBLICATIONS

Haraguchi et al. "Multicolumn cell: Evaluation of the proof of concept system", J. Vac. Sci. Technol. B 22(3), May/Jun. 2004, 2004 American Vcuum Society.
International Search Report on PCT/JP2007/056246, issued by Japanese Patent Office.
A. Yamada et al, 2004-88071, Japan, Electron Beam Aligner, Electron Beam Exposure Method, Method for Manufacturing Semiconductor Element, Mask, and Mask Manufacturing Method Publication, Mar. 18, 2004.

(Continued)

*Primary Examiner* — Jack Berman
*Assistant Examiner* — Meenakshi Sahu
(74) *Attorney, Agent, or Firm* — Muramatsu & Associates

(57) ABSTRACT

A multi-column electron beam exposure apparatus includes: a plurality of column cells; a wafer stage including an electron-beam-property detecting unit for measuring an electron beam property; and a controller for measuring beam properties of electron beams used in all the column cells by using the electron-beam-property detecting unit, and for adjusting the electron beams of the respective column cells so that the properties of the electron beams used in the column cells may be approximately identical. The electron beam property may be any of a beam position, a beam intensity, and a beam shape of the electron beam to be emitted. The electron-beam-property detecting unit may be a chip for calibration with a reference mark formed thereon or a Faraday cup.

11 Claims, 10 Drawing Sheets

OTHER PUBLICATIONS

T. Haraguchi et al., Multicolumn cell: Evaluarion of the proof of concept system Publication, May 4, 2004.

Y. Someta et al., 8-191042 Japan, Electron Beam Exposure System and Adjusting Method Thereof Publication, Jul. 23, 1996.

M. Hayashi et al, 11-329322, Japan, Electron Gun, and Exposure Device and Exposure Method Using It Publication, Oct. 13, 2000.

A. Yamada, 2006-278492, Japan Electron Beam Exposure Device and Method of Exposing Electron Beam Publication, Oct. 12, 2006.

N. Shimazu, 61-283121, Japan, Charged Beam Projecting Exposure Device Publication, Jan. 17, 2003.

H. Ota et al., 2002-203777, Japan, Electron Beam Image Drawing Method and System Thereof Publication, Jul. 19, 2002.

International Search Report.

\* cited by examiner

MULTI-COLUMN ELECTRON BEAM EXPOSURE APPARATUS AND MULTI-COLUMN ELECTRON BEAM EXPOSURE METHOD

CROSS-REFERENCE TO RELATED APPLICATIONS

This application is a continuation of prior International Patent Application No. PCT/JP2007/056246, filed Mar. 26, 2007, the entire contents of which are incorporated herein by reference.

BACKGROUND OF THE INVENTION

1. Field of the Invention

The present invention relates to an electron beam exposure apparatus and an electron beam exposure method. Particularly, it relates to a multi-column electron beam exposure apparatus and a multi-column electron beam exposure method which are suitable for exposing process with multiple column cells.

2. Description of the Prior Art

In prior art electron beam exposure apparatuses, a variable rectangular opening or multiple stencil mask patterns are provided to a stencil mask, and a certain pattern of the opening or a certain stencil mask pattern is selected by beam deflection and is exposed and transferred onto a wafer. Although multiple mask patterns are prepared in an electron beam exposure apparatus of this type, the number of electron beams used for exposure is one, and only one mask pattern is transferred at one time.

As such an exposure apparatus, for example, Japanese Patent Application Publication No. 2004-88071 discloses an electron beam exposure apparatus which performs partial batch exposure. In the partial batch exposure, one pattern area (for example, a 300×300 μm area) selected by beam deflection from multiple (for example, 100 pieces of) stencil patterns disposed on a mask is irradiated with a beam. The cross section of the beam is shaped into the shape of the stencil pattern. The beam which has passed through the mask is deflected back by a deflector at a later stage. The beam is reduced to a certain reduction percentage (for example, 1/60) decided according to a property of an electron optical system, and the pattern is transferred onto a wafer surface by using the beam. The area of the wafer surface irradiated at one time is 5×5 μm, for example. When the stencil patterns on the mask are appropriately prepared according to device patterns to be exposed, the necessary number of exposure shots is reduced significantly and throughput is improved accordingly, compared with a case where only the variable rectangular opening is used.

Furthermore, a multi-column electron beam exposure apparatus has been proposed, in which multiple of such columns each made smaller in size (hereinafter, referred to as column cells) are collected and arranged in parallel on a wafer for exposing process (see T. Haraguchi, et al., J. Vac. Sci. Technol, B22 (2004) 985). Each of the column cells is equivalent to a column in a single-column electron beam exposure apparatus. However, since the exposing process is performed by the multi-columns as a whole arranged in parallel, exposure throughput can be increased by severalfold of the columns.

As described above, improvement in throughput can be attained in the multi-column electron beam exposure apparatus.

However, connection accuracy across exposure patterns is reduced at a boundary of irradiation areas of column cells. FIGS. 1A and 1B show an example in which a desired pattern is not obtained at a position across adjacent column cells. FIG. 1A shows a desired pattern 3 at a boundary between an irradiation area 1 of a first column cell and an irradiation area 2 of a second column cell. FIG. 1B shows an example of a pattern obtained as a result of exposure. The irradiation area 1 is exposed as a pattern 5, and the irradiation area 2 is exposed as a pattern 4. Accordingly, the obtained pattern differs from the desired exposure pattern 3. In this manner, there arises a case where the width of the exposure pattern varies from area to area and a desired exposure pattern may not be obtained. Moreover, a position to be exposed may shift, and the pattern may be separated at worst.

There is no particular problem when a design is made not to expose a pattern continuing across column cells as mentioned above. However, when the design is made taking positions of multiple column cells into consideration, the design flexibility is markedly reduced. Accordingly, exposure of a pattern continuing across column cells is inevitable.

Moreover, there is no particular problem, for example, when patterns to be drawn are wide and may be shifted at a connection position across column cells as long as the patterns are connected. However, when the patterns are narrow as in a case of a transistor gate, higher connection accuracy is demanded.

SUMMARY OF THE INVENTION

The present invention has been made in consideration of the problems in the prior art. An object of the present invention is to provide a multi-column electron beam exposure apparatus and a multi-column electron beam exposure method which achieve improved connection accuracy of patterns across column cells in the multi-column electron beam exposure apparatus.

The above-mentioned object is attained with a multi-column electron beam exposure apparatus including: a plurality of column cells; a wafer stage including an electron-beam-property detecting unit for measuring an electron beam property; and a controller for measuring beam properties of electron beams used in all the column cells by using the electron-beam-property detecting unit, and for adjusting the electron beams of the respective column cells so that the properties of the electron beams used in the column cells become approximately identical to one another.

In the multi-column electron beam exposure apparatus according to this aspect, the electron beam property may be any of a beam position, a beam strength, and a beam shape of the electron beam to be emitted. Moreover, the electron-beam-property detecting unit may be a chip for calibration with a reference mark formed thereon or a Faraday cup.

Moreover, in the multi-column electron beam exposure apparatus according to this aspect, one electron-beam-property detecting unit for measuring the electron beam property of a same kind may be provided on an edge portion of the wafer stage. The controller performs the following operations. Specifically, using one column cell among the plurality of column cells as a reference column cell, and using an electron beam of the reference column cell as a reference beam, the controller moves the electron-beam-property detecting unit to a predetermined position below each of all the column cells to measure the beam properties of the electron beams of the column cells. Then, the controller adjusts the electron beam of each column cell other than the reference column cell so that a difference between the property of the electron beam used in the column cell and the property of the reference beam becomes within a predetermined value.

In the present invention, the beam property is adjusted so that the beam properties of the electron beams emitted in the plurality of column cells become approximately identical to each other. One column cell is selected among the plurality of column cells. By using the electron beam emitted from an electron gun of the column cell as the reference beam, the electron beams of the other column cells are adjusted so as to have a beam property approximated to the beam property of the reference beam. Thereby, the beam properties of the electron beams emitted in the plurality of column cells become approximately identical. Thus, it becomes possible to prevent shifting of an irradiation position or prevent variations of the pattern width, even when a pattern extending across column cells is exposed. Accordingly, precise pattern exposure is attained.

Moreover, the multi-column electron beam exposure apparatus according to this aspect may include: n electron-beam-property detecting units Mk ($1 \leq k \leq n$) provided on an edge portion of the wafer stage, the electron-beam-property detecting units Mk being for measuring the electron beam property of the same kind; n column cell groups Gk ($1 \leq k \leq n$) each including a plurality of column cells; and at least one column cell being common to the column cell group Gk and a column cell group Gk+1. In the multi-column electron beam exposure apparatus, the controller performs the following operations. Specifically, using one column cell among the plurality of column cells as the reference column cell, and using the electron-beam-property detecting unit Mk, the controller measures a property of an electron beam of each column cell within a column cell group Gk including the reference column cell. Then, the controller adjusts a difference between the property of the electron beam of each column cell and the beam property of the electron beam of the reference column cell so that the difference becomes within a predetermined value. Subsequently, the controller measures a beam property of the electron beam of each column cell of the column cell group Gk+1 ($1 \leq k \leq n-1$) by using an electron-beam-property detecting unit Mk+1 ($1 \leq k \leq n-1$). Thereafter, the controller adjusts the beam property on the basis of the electron beam property of the common column cell.

In the present invention, a plurality of electron-beam-property detecting devices (units) are used for detection of beam properties, of a same kind, of the electron beams of the plurality of column cells. Each electron-beam-property detecting device detects the beam properties of the electron beams of the column cell group which has a pre-determined number of the plurality of column cells. The column cell groups have a column cell in common, and the beam properties of the electron beams of the other column cells in the column cell group are detected and adjusted on the basis of the beam property of the electron beam of the common column cell. This makes the beam properties of the electron beams of all the column cells approximately identical. Even when a pattern extending across column cells is formed, the beam properties, such as the irradiation position, intensity, and the like of the electron beam, are identical among the column cells. Accordingly, improvement in the connection accuracy of the patterns is possible.

Moreover, since the properties of the electron beams used in the plurality of column cells is measured using the electron-beam-property detecting device located at a position close to those column cells, a range of the wafer stage moves in order to measure the beam properties can be small. Accordingly, deterioration of moving accuracy of the wafer stage is prevented, and in addition, a large space provided for the wafer stage movement is no longer necessary, thereby attaining miniaturization of the apparatus.

Furthermore, another aspect of the present invention provides a multi-column electron beam exposure method used for the multi-column electron beam exposure apparatus according to the above-mentioned aspect. The multi-column electron beam exposure method according to this aspect includes the steps of: selecting a column cell serving as a reference among the plurality of column cells; measuring a beam property of a reference beam by using an electron-beam-property detecting unit, the reference beam being an electron beam of the column cell serving as the reference; measuring a beam property of an electron beam used in a column cell other than the reference column cell by using the electron-beam-property detecting unit; adjusting a difference between the beam property of the reference beam and the beam property of the electron beam other than the reference beam, to be within a predetermined value; and performing exposing process, using the electron beams of all the column cells, the electron beams having beam properties approximately identical to each other.

DESCRIPTION OF THE PREFERRED EMBODIMENTS

Figure 2:
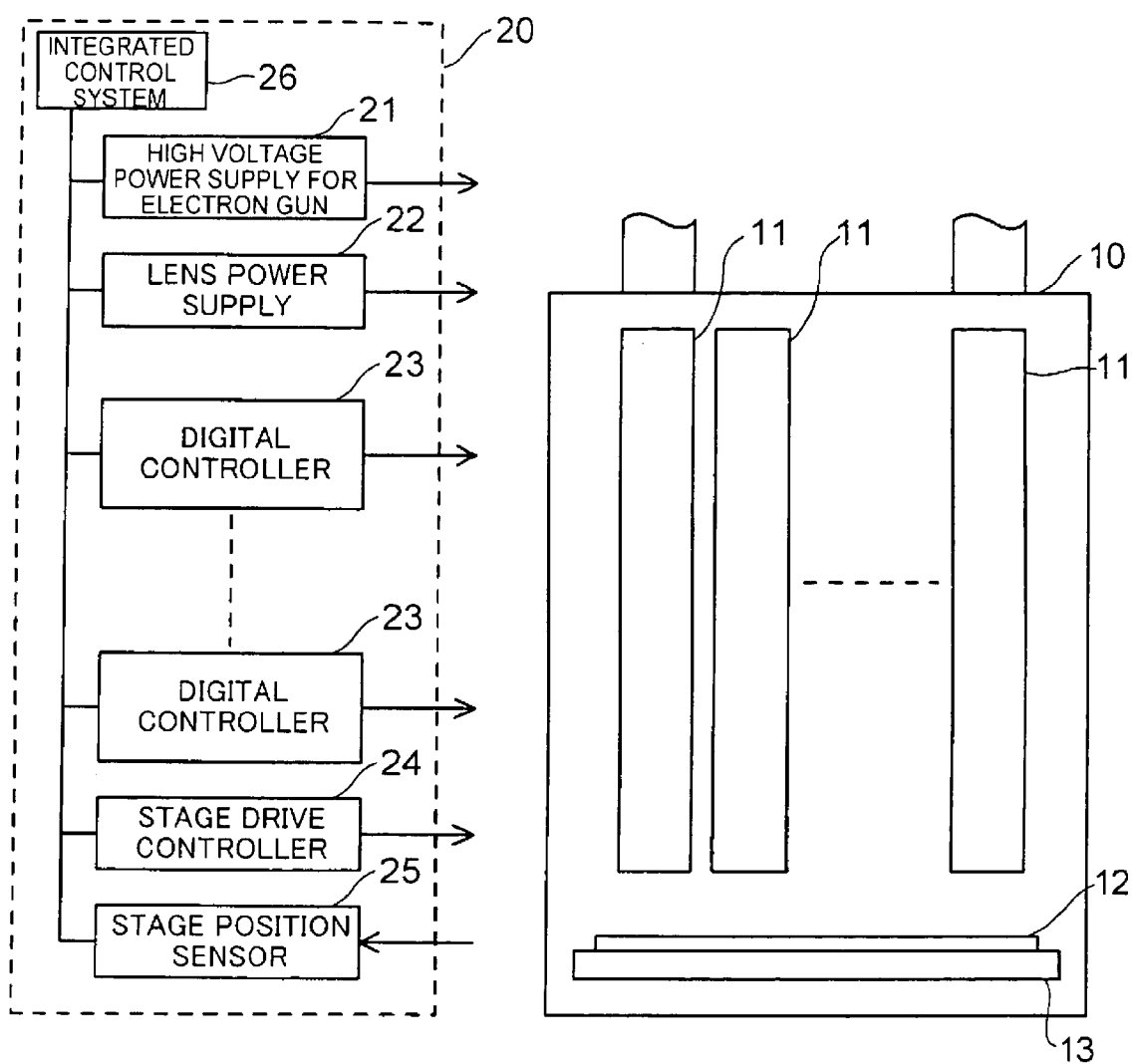
FIG. 2 is a configuration diagram of a multi-column electron beam exposure apparatus according to the present invention.

Hereinafter, embodiments of the present invention will be described with reference to the drawings.
(1) First Embodiment
Configuration of Multi-column Electron Beam Exposure Apparatus FIG. 2 is a schematic configuration diagram of a multi-column electron beam exposure apparatus according to the present embodiment. The multi-column electron beam exposure apparatus is mainly divided into an electron beam column 10 and a controller 20 which controls the electron beam column 10. The electron beam column 10 includes multiple (for example, 16) identical column cells 11 to form the entire column. Every column cell 11 has the same structure which will be described later. Below the column cells 11, a wafer stage 13 is disposed, on which, for example, a 300-mm wafer 12 is mounted.

The controller 20 includes a high voltage power supply 21 for electron gun, a lens power supply 22, a digital controller 23, a stage drive controller 24, and a stage position sensor 25. The high voltage power supply 21 for electron gun supplies power for driving an electron gun of each column cell 11 within the electron beam column 10. The lens power supply 22 supplies power for driving an electromagnetic lens of each column cell 11 within the electron beam column 10. The digital controller 23 is an electrical circuit which controls each part of the column cell 11, and outputs a deflection output at a high speed, etc. Typically, the number of the digital controllers 23 corresponds to the number of the column cells 11.

On the basis of positional information from the stage position sensor 25, the stage drive controller 24 moves the wafer stage 13 so that a desired position of the wafer 12 may be irradiated with an electron beam. Each of the above-mentioned parts 21 to 25 is controlled by an integrated control system 26 such as a workstation in an integrative manner.

In the multi-column electron beam exposure apparatus mentioned above, every column cell 11 is formed of the same column unit.

Figure 3:
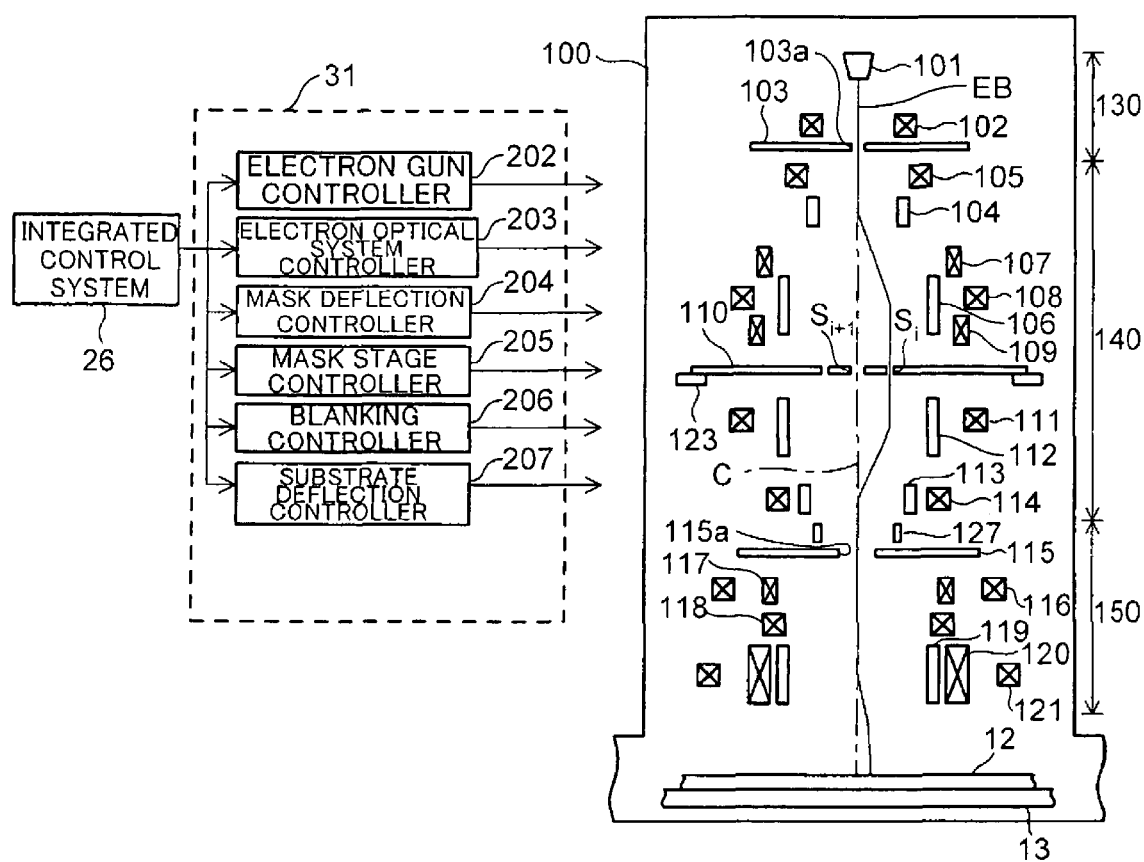
FIG. 3 is a configuration diagram of one column cell in the exposure apparatus of FIG. 2.

FIG. 3 is a schematic configuration diagram of each column cell 11 used for the multi-column electron beam exposure apparatus.

Each column cell 11 is mainly divided into an exposure part 100 and a column cell controller 31 which controls the exposure part 100. The exposure part 100 is formed of an electron beam generation portion 130, a mask deflection portion 140, and a substrate deflection portion 150.

In the electron beam generation portion 130, an electron beam EB generated from an electron gun 101 is converged by a first electromagnetic lens 102. Subsequently, the electron beam EB transmits through a rectangular aperture 103a in a mask 103 for beam shaping, so that the cross section of the electron beam EB is shaped into a rectangular shape.

Next, the electron beam EB forms an image on an exposure mask 110 with a second electromagnetic lens 105 of the mask deflection portion 140. Then, the electron beam EB is deflected by first and second electrostatic deflectors 104 and 106 into a particular pattern S formed on the exposure mask 110, so that the cross sectional shape of the electron beam EB is shaped into the shape of the pattern S.

Although the exposure mask 110 is fixed onto a mask stage 123, the mask stage 123 is movable horizontally. Thus, when the pattern S located in a portion outside a deflection range (beam deflection area) of the first and second electrostatic deflectors 104 and 106 is used, the pattern S comes into the beam deflection area by moving the mask stage 123.

Third and fourth electromagnetic lenses 108 and 111 respectively arranged above and below the exposure mask 110 are adjusted their current amounts, thereby forming an image on a substrate by the electron beam EB.

The electron beam EB which has passed through the exposure mask 110 is deflected back to an optical axis C by deflection action of third and fourth electrostatic deflectors 112 and 113. Subsequently, the size of the electron beam EB is reduced by a fifth electromagnetic lens 114.

First and second correction coils 107 and 109 are provided in the mask deflection portion 140, and correct beam deflection aberration caused by the first to the fourth electrostatic deflectors 104, 106, 112, and 113.

Then, the electron beam EB passes through an aperture 115a of a shield plate 115 which constitutes the substrate deflection portion 150, and is projected on a substrate by first and second projection electromagnetic lenses 116 and 121. Thereby, an image with the pattern of the exposure mask 110 is transferred onto the substrate at a predetermined reduction percentage, for example, a reduction percentage of $\frac{1}{10}$.

Fifth electrostatic deflector 119 and an electromagnetic deflector 120 are provided in the substrate deflection portion 150, and these deflectors 119 and 120 deflect the electron beam EB, so that the image with the pattern of the exposure mask 110 is projected to a predetermined position of the substrate.

Furthermore, third and fourth correction coils 117 and 118 for correcting deflection aberration of the electron beam EB on the substrate are provided in the substrate deflection portion 150.

The column cell controller 31 includes an electron gun controller 202, an electron optical system controller 203, a mask deflection controller 204, a mask stage controller 205, a blanking controller 206, and a substrate deflection controller 207. The electron gun controller 202 controls the electron gun 101 to control the acceleration voltage, beam radiation conditions, and the like of the electron beam EB. The electron optical system controller 203 controls current amounts applied to the electromagnetic lenses 102, 105, 108, 111, 114, 116, and 121, and the like, to thereby adjust the magnification, focal position, and the like of an electron optical system formed of these electromagnetic lenses. The blanking controller 206 deflects the electron beam EB generated before start of exposure onto the shield plate 115 by controlling a voltage applied to a blanking electrode 127, to thereby prevent irradiation of the substrate with the electron beam EB before the exposure.

The substrate deflection controller 207 controls a voltage applied to the fifth electrostatic deflector 119 and a current amount applied to the electromagnetic deflector 120, so as to deflect the electron beam EB onto a predetermined position of the substrate. Each of the above-mentioned parts 202 to 207 is controlled by the integrated control system 26 such as a workstation in an integrative manner.

Figure 4:
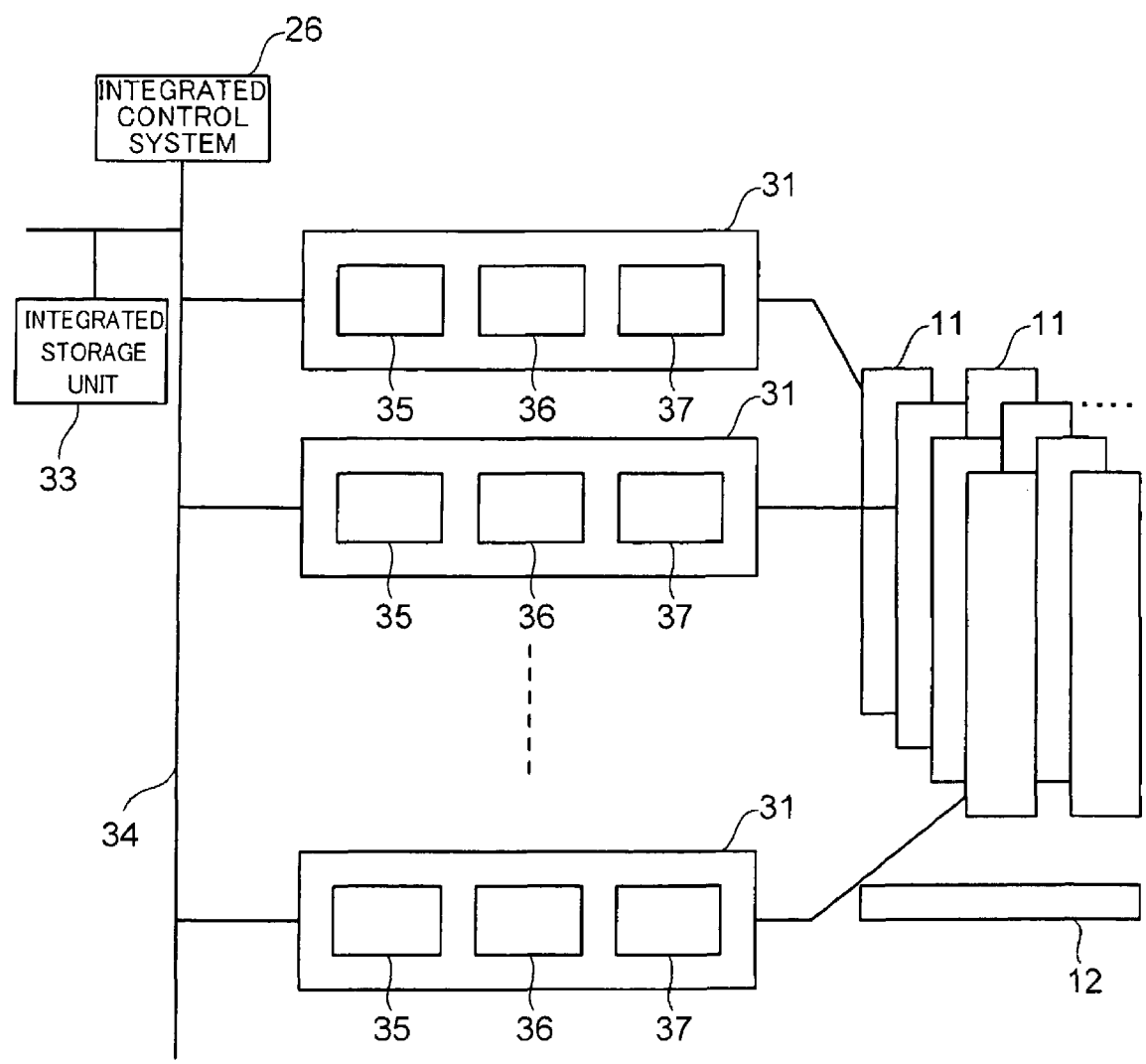
FIG. 4 is a schematic diagram of a column cell controller of the exposure apparatus of FIG. 2.

FIG. 4 is a schematic diagram of the column cell controller 31 in the multi-column electron beam exposure apparatus. Each of the column cells 11 includes the column cell controller 31. Each column cell controller 31 is connected to the integrated control system 26 with a bus 34. The integrated control system 26 controls the entire multi-column electron beam exposure apparatus. Moreover, an integrated storage unit 33 is formed of, for example, a hard disk in which data such as exposure data needed in all the column cells is stored. The integrated storage unit 33 is also connected to the integrated control system 26 with the bus 34.

Figure 5:
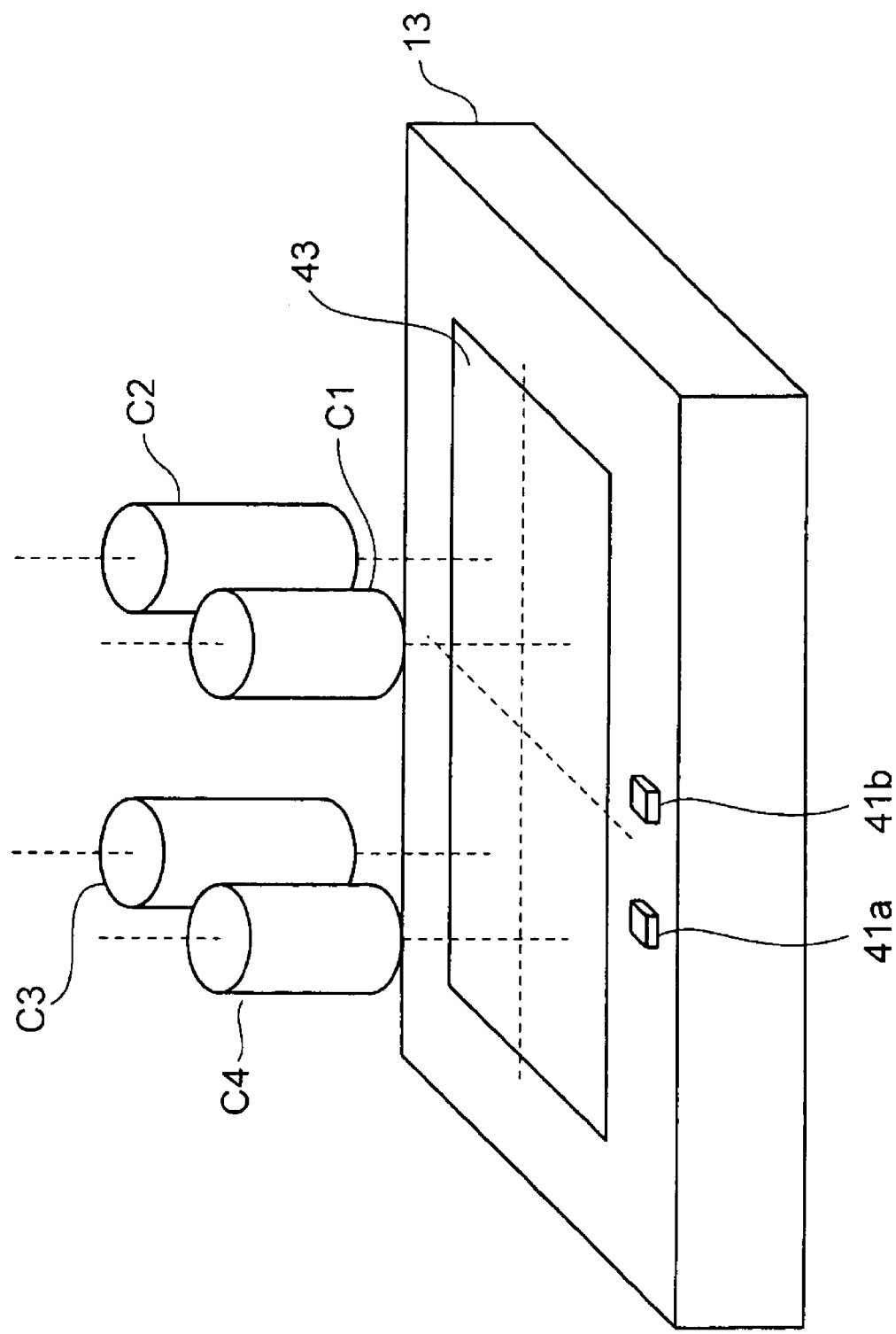
FIG. 5 is a conceptual diagram of the exposure apparatus when the number of the column cells is 4.

FIG. 5 is a conceptual diagram of the entire exposure apparatus including four column cells C1, C2, C3, and C4. The column cells C1, C2, C3, and C4 are disposed in an array form of 2×2. The distances between C1 and C2, between C2 and C3, between C3 and C4, and between C4 and C1 are, for example, 75 mm.

One wafer stage 13 is disposed below all the column cells C1, C2, C3, and C4. An electron-beam-property detecting device 41 (for example, a calibration chip 41a and a Faraday cup 41b) is provided on an edge portion of the wafer stage 13. The electron-beam-property detecting device (also referred to as "electron-beam-property detecting unit") 41 measures the properties of an electron beam in order to adjust the beam intensity and beam position of the electron beam. The wafer stage 13 is capable of measuring the position using the stage position sensor 25 such as a laser measuring device, and accurately moving the electron-beam-property detecting device 41 to a desired position.

In the multi-column electron beam exposure apparatus thus formed, exposure data on a pattern to be exposed on the wafer placed on the wafer stage 13 is transferred from the integrated storage unit 33 to a column cell storage unit 35 (FIG. 4) of each column cell controller 31. When the transferred exposure data needs to be corrected, the exposure data is corrected in a correction unit 36 (FIG. 4) of each column cell controller 31. As a result, the same pattern is exposed to an exposure area on the wafer 12 assigned to each column cell 11.

Next, description will be given on a process for adjusting the beam properties of electron beams used in multiple column cells to be approximately identical by using the electron-beam-property detecting device 41.

Figure 6:
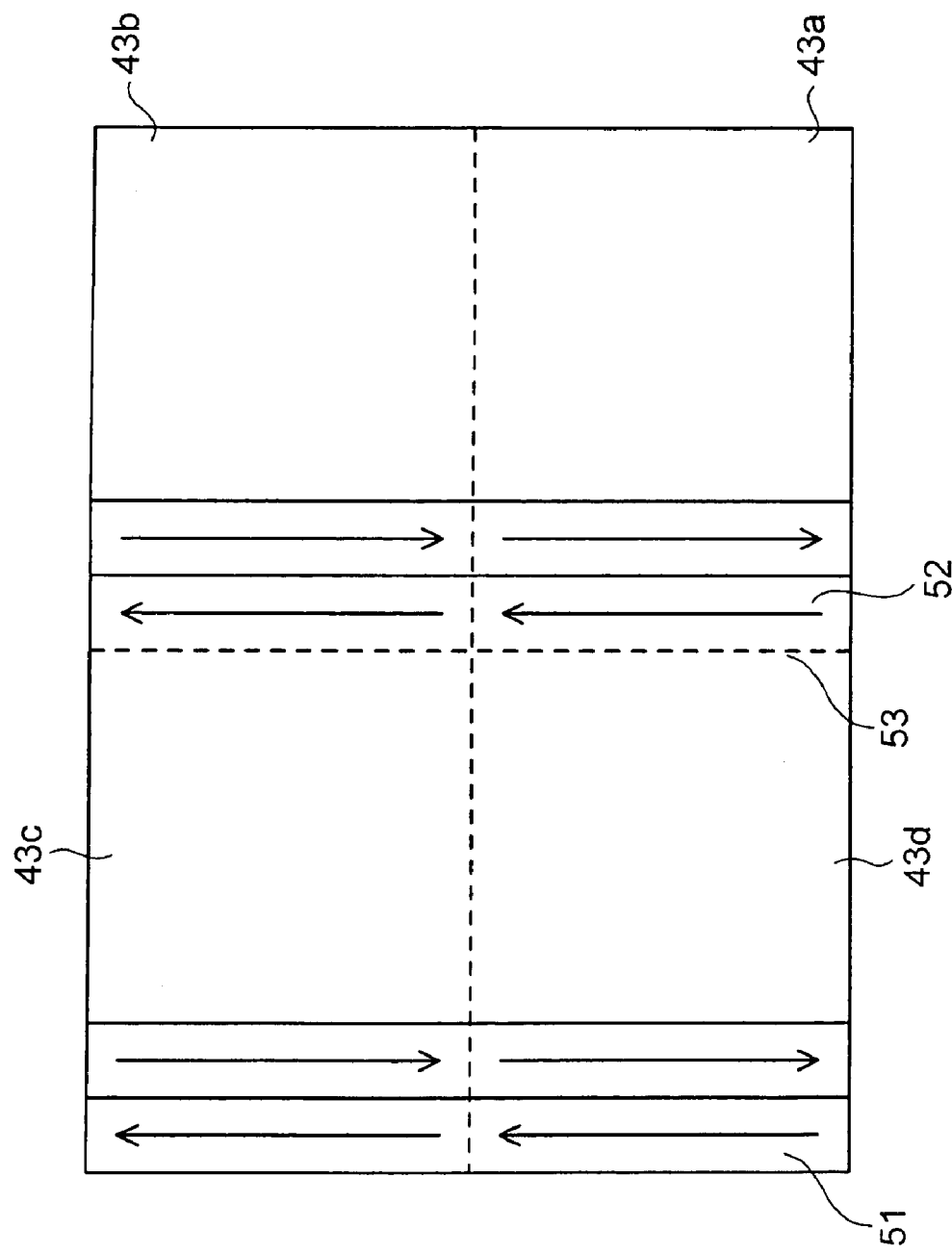
FIG. 6 is a drawing showing an exposure range of the column cell in the exposure apparatus of FIG. 5.

FIG. 6 is a drawing showing an area of a specimen 43 irradiated with the electron beams of the four column cells. Reference numerals 43a to 43d denote an irradiation area of each column cell. For example, in the irradiation area 43d, exposing process is performed on each field from the left side of FIG. 6 in a sequence shown by an arrow 51. Similarly, in the irradiation area 43a, exposing process is performed in a sequence shown by an arrow 52.

Figure 1A:
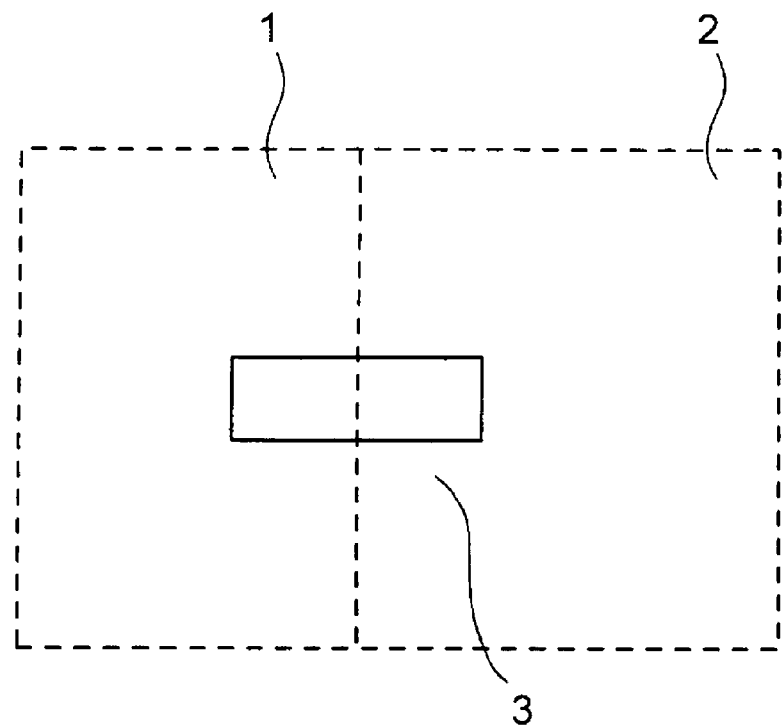
FIGS. 1A and 1B are drawings illustrating problems in a multi-column electron beam exposure apparatus.
Figure 1B:
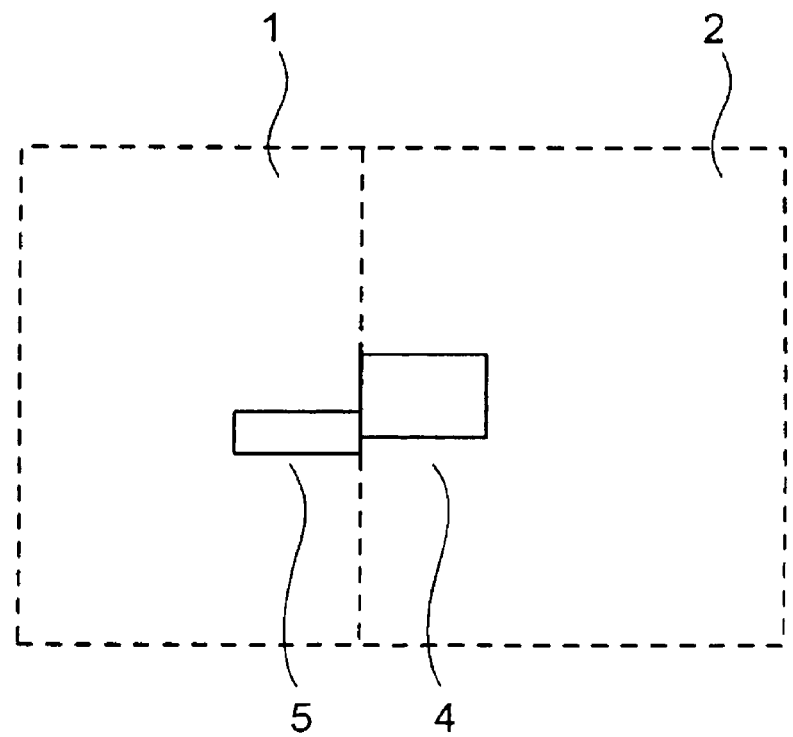

In such an exposing process, when a pattern extending across column cells is exposed, a phenomenon that connection accuracy of the pattern is worsened occurs, as shown in FIG. 1B. As this cause, it is conceivable that there is a difference in irradiation time of the electron beams in the vicinity of a boundary 53 between the irradiation area 43d and the irradiation area 43a, which results in a difference in positional accuracy and intensity of the electron beam used in each column cell. Thus, the present inventors come up with a possibility of improving the connection accuracy of the above-mentioned pattern extending across the column cells by equalizing the properties of the electron beams which are used in all the column cells.

In the present embodiment, a beam position property, a beam intensity property, and a beam shape property are targeted. The beam position property is a property which shows whether a desired position is accurately irradiated with the beam to be emitted. The beam intensity property is a property which shows the intensity of the beam and shows the size of the beam current. The beam shape property is a property which shows whether the beam has a desired shape when the beam is shaped into, for example, a variable rectangular beam.

Additionally, cases where the calibration chip 41a and the Faraday cup 41b are used as the electron-beam-property detecting device 41 are targeted.

Figure 7A:
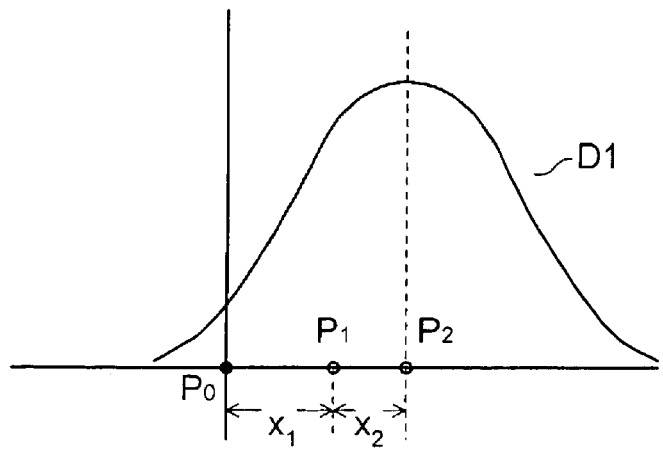
FIGS. 7A to 7C are drawings illustrating shift in a beam position.
Figure 7B:
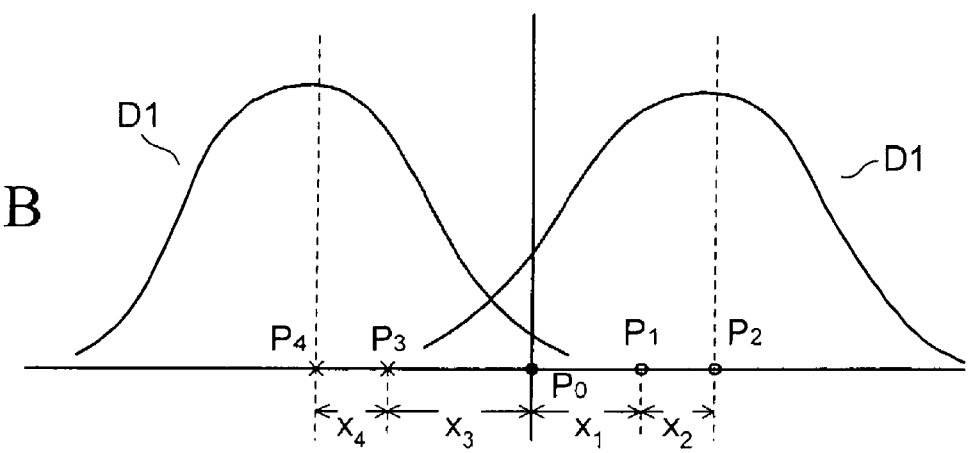
Figure 7C:
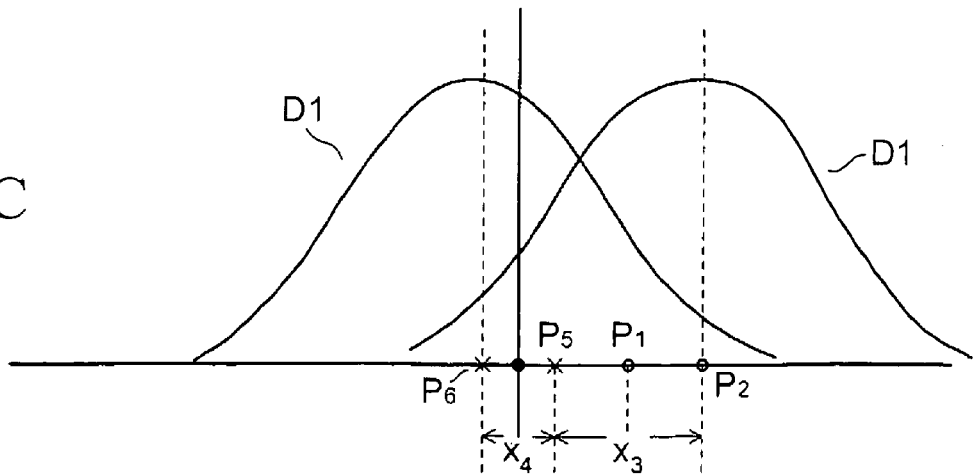

FIGS. 7A to 7C are drawings illustrating shift from a target position occurs when the target position is irradiated with an electron beam.

The abscissas in FIGS. 7A to 7C show a position, and the ordinates show probability distribution of variation of the beam irradiated position. Moreover, a true position to be irradiated with the beam is set to an origin PO. As factors that the irradiation position of the electron beam is shifted, positional shift due to setting of the voltage or the like applied to the deflectors of the exposure apparatus, positional shift due to drift, and beam position fluctuation at the time of drawing are taken into consideration.

FIG. 7B shows a predicted value of connection shift between the column cells when the column cells are independently aligned with the true position. In other words, it shows a predicted value of connection shift based on the true position. The irradiation positional shift of the first column cell is the same as that of FIG. 7A. Suppose that the irradiation position of the electron beam of the second column cell is moved to P3 from the true position PO due to deflection amount error, and further moved to P4 due to beam position drift at the time of drawing. Under this condition, FIG. 7B shows a case where the error is the largest between the first column cell and the second column cell.

FIG. 7B is a drawing showing a predicted value of connection shift between the column cells when the column cells are independently aligned with the true position. In other words, shown is a predicted value of connection shift based on the true position. The irradiation positional shift of the first column cell is the same as that of FIG. 7A. Suppose that the irradiation position of the electron beam of the second column cell is moved to P3 from the true position PO due to deflection amount error, and further moved to P4 due to beam position drift at the time of drawing. At this time, FIG. 7B shows a case where the error is the largest between the first column cell and the second column cell.

FIG. 7C is a drawing showing a predicted value of connection shift across the column cells when connection across the column cells is given priority in terms of adjustment. In other words, FIG. 7C is a drawing showing a predicted value of connection shift across the column cells based on a position irradiated in the first column cell.

As shown in FIG. 7C, based on the position P2 irradiated with the electron beam of the first column cell, a position away from P2 by the distance of X3 is a position P5 due to deflection amount error of the electron beam of the second column cell, and a position further away from P5 by the distance of X4 is a position P6 due to beam position drift at the time of drawing. This case also shows a case where the error is the largest between the first column cell and the second column cell.

Thus, considering the case where the error is at maximum when the pattern is connected across the column cells, the connection error across the columns is made smaller by adjusting the electron beam of another column cell on the basis of the electron beam of one column cell determined in advance than by separately adjusting the electron beam on the basis of the true position.

For this reason, in the present embodiment, the beam properties of the electron beams in multiple column cells of the multi-column electron beam exposure apparatus are adjusted so that, using the electron beam in one column cell as a reference beam, the beam properties of the electron beams of other column cells may correspond to the beam property of the reference beam.

Hereinafter, description will be given on a case where the beam properties of the electron beams of all the column cells are measured using one electron-beam-property detecting device 41, and the beam property of the same kind is adjusted in accordance with the reference beam.

In the present embodiment, description will be made taking the following case as an example. Specifically, the beam position is measured by the calibration chip 41a and the beam position is corrected; then, the beam intensity is measured by the Faraday cup 41b and the beam intensity is corrected (see FIG. 5).

A column cell to serve as the reference is selected (referred to as a column cell 1), and the electron beam emitted from the electron gun of the column cell 1 is used as a reference beam. The beam position property of the reference beam is calculated.

A reference mark formed on the calibration chip 41a is used to detect the beam position property by a well-known method. Specifically, the wafer stage is moved so that a center of the reference mark may be located directly below an optical axis of each column cell, and a deflector is used to scan the electron beam so that the reference mark may be irradiated with the electron beam. A backscattered electron detector detects backscattered electron signals at the time of scanning, and the beam irradiation position is calculated by performing signal processing on the backscattered electron signals.

In comparison with a position where the actual reference mark is disposed, the irradiation position of the electron beam is calculated and the beam position property is measured.

When the beam is not deflected and is on the optical axis, an edge is detected at the same position as that of the edge of the reference mark. On the other hand, when the beam is shifted, the edge detection position is different from the position of the reference mark.

In the present embodiment, the position shifted from the true position is set as a reference position, and this electron beam is set as the reference beam.

Next, in order to measure the electron beam properties of the other column cells, the same reference mark as used in order to examine the property of the reference beam is used. The wafer stage is moved so that the reference mark may be located directly below the optical axis of each column cell.

Similar to the case of measuring the reference beam, the electron beam of each column cell is scanned by the deflector, backscattered electron signals of the reference mark are acquired, and positional shift of the electron beam from the edge position is measured.

A value for correcting a voltage amount applied to the fifth electrostatic deflector 119 of each column cell is calculated so that this positional shift may be approximated to the positional shift measured with the reference beam.

A difference between the irradiation position of the electron beam of each column cell and the irradiation position of the reference beam is adjusted so that the difference can take a predetermined value, for example, several nm.

As for the voltage applied to the electrostatic deflector having a 2-way electrode in an x direction and a y direction of the deflector which changes the irradiation position of the electron beam on the specimen, an input in the x direction is represented by a formula (1), and an input in the y direction is represented by a formula (2).

$$X'=AX+BY+HxXY+Ox(t) \quad (1)$$

$$Y'=CX+DY+HyXY+Oy(t) \quad (2)$$

A voltage proportional to this value is applied to the electrode of the electrostatic deflector to deflect the electron beam. In the formulas, A, B, C, D, Hx, Hy, Ox, and Oy are adjustment coefficients.

In order to make the above-mentioned positional shift within a value not more than the predetermined value, for example, Ox and Oy are adjusted in the voltage applied to the deflector so that the positional shift may be approximated to the position of the reference beam.

These values are stored in each column cell storage unit 35, and the electron beam is deflected at a corrected voltage when the electron beam is irradiated in each column cell.

The above-mentioned process is performed on the electron beams of all the column cells other than the reference column cell to make the beam position properties of all the electron beams approximately identical.

Next, the electron beam intensities of the electron beams of all the column cells are made approximately identical. The intensity (current value) of the electron beam is measured by using the Faraday cup and measuring the current value of the electron beam with which the reference position is irradiated.

In the present embodiment, measurement of the current value of the electron beam of each column cell is performed using one Faraday cup and an ammeter.

In addition, the beam position property of the electron beam of each column cell is adjusted. When the position is not adjusted, only a part of the electron beam enters the Faraday cup in some cases. For that reason, the beam to be used is adjusted so that the same position can be irradiated with the beam.

In order to measure the current value of the reference beam used in the reference column cell, the wafer stage is moved so that the Faraday cup 41b shown in FIG. 5 may be located directly below the optical axis of the reference column cell. Then, irradiation with the electron beam for a predetermined time is performed to measure the current value.

Similar to the case of the beam position, an adjustment coefficient for the beam intensity is changed so that a difference from the beam intensity of the reference beam becomes less than a predetermined value, for example, less than 1 nA in a case of a rectangle of 100 nm×100 nm.

For example, in a case of a variable rectangle, an electron beam having a cross section shaped into rectangle is aligned on a rectangular opening of a mask, and shaped into a rectangle having a width Sx and a length Sy. As for a voltage applied to the electrostatic deflector having a 2-way electrode in an x direction and a y direction at this time, an input in the x direction is represented by a formula (3), and an input in the y direction is represented by a formula (4).

$$Sx'=ASx+BSy+HxSxSy+Ox(t) \quad (3)$$

$$Sy'=CSx+DSy+HySxSy+Oy(t) \quad (4)$$

In the above-mentioned formulas (3) and (4), the coefficients Ox, Oy, or the coefficients A to D are adjusted so that the beam intensity may be approximated to the reference beam intensity. Moreover, shot time of the beam may be adjusted to adjust the beam current in accordance with a reference value. These values are stored in each column cell storage unit 35, and upon actual exposure, exposing process is performed in accordance with this data.

When there is an extremely large difference in beam intensity from that of the reference beam, drastic change of the shape of the variable rectangle causes a larger difference in the shape of the beam from that of the reference beam. Accordingly, a desired pattern shape may not be exposed. In this case, the adjustment coefficient is determined in consideration of both the beam intensity and the beam shape of the references.

Moreover, the beam shape is measured by: scanning the electron beam in the same manner as measurement of the beam position; passing the electron beam on the reference mark to detect an edge; and detecting the length of the beam in the scanning direction on the basis of a distance between the edges of the reference mark and a distance between the detected edges.

As described above, in the multi-column electron beam exposure apparatus of the present embodiment, the beam properties, of the same kind, of the electron beams used in the multiple column cells are detected using one electron-beam-property detecting device, and the beam properties of the electron beams of the other column cells are adjusted so as to be equivalent to the properties of one beam serving as the reference. For example, the multi-column electron beam exposure apparatus is configured so as to detect the irradiation position of the electron beam using the reference mark, a backscattered electron detector, etc. so that the irradiation positions of the electron beams can be relatively identical in all the column cells. Thereby, the beam properties of the electron beams used in all the column cells are made approximately identical. Since the beam properties, such as the irradiation position and intensity of the electron beam, are identical among the column cells, even when the pattern extending across the column cells is formed, improvement in the connection accuracy of the pattern is possible.

Adjustment of the beam properties is performed at a predetermined time before start of exposure or during exposure. When the pattern extending across the column cells is fine and demands accuracy, the number of times of adjustment of the beam properties is increased even during exposure.

When the number of times of adjustment of the beam properties is increased, the exposing process is interrupted in accordance with the number of times, and therefore, a process speed is slowed. However, the connection accuracy of pattern across the column cells may be reduced by reduction of adjustment of the beam properties, and the pattern may be disconnected at worst. Moreover, the accuracy of the pattern formed by then is not guaranteed, either. Accordingly, the exposing process may be again performed from the start, and the throughput may be more deteriorated than in the case where the exposing process is interrupted during exposure.

It is also possible to detect the beam intensity from an amount of the backscattered electrons not only from the beam position by use of the reference mark on the calibration chip 41a. However, in order to accurately detect the beam intensity of the electron beam, use of the Faraday cup 41b is desirable.

Moreover, the beam shape can be determined using the reference mark on the calibration chip 41a. Accordingly, the shape may be measured simultaneously with measurement of the beam position.

While measurement of the beam intensity with the Faraday cup 41b has been described in the present embodiment, the beam position may be measured by a beam position detector including the Faraday cup 41b, or the beam shape may be measured by a beam shape detector including the Faraday cup 41b.

By measuring the beam position property, the beam intensity property, and the beam shape property with the reference mark on the calibration chip 41a, the number of times of movement of the wafer stage 13 can be reduced, and the time for measurement can be shortened. The same effect is also obtained when the beam properties are measured using the Faraday cup 41b.

In the description above, the beam properties of the other column cells are adjusted in accordance with the reference beam in the state that the reference beam is shifted from the true position. However, a beam corrected in accordance with the true position may be used as the reference beam. This allows beam irradiation at an ideal position.

(Multi-column Electron Beam Exposure Method)

Next, an exposure method in the above-mentioned multi-column electron beam exposure apparatus will be described.

Figure 8:
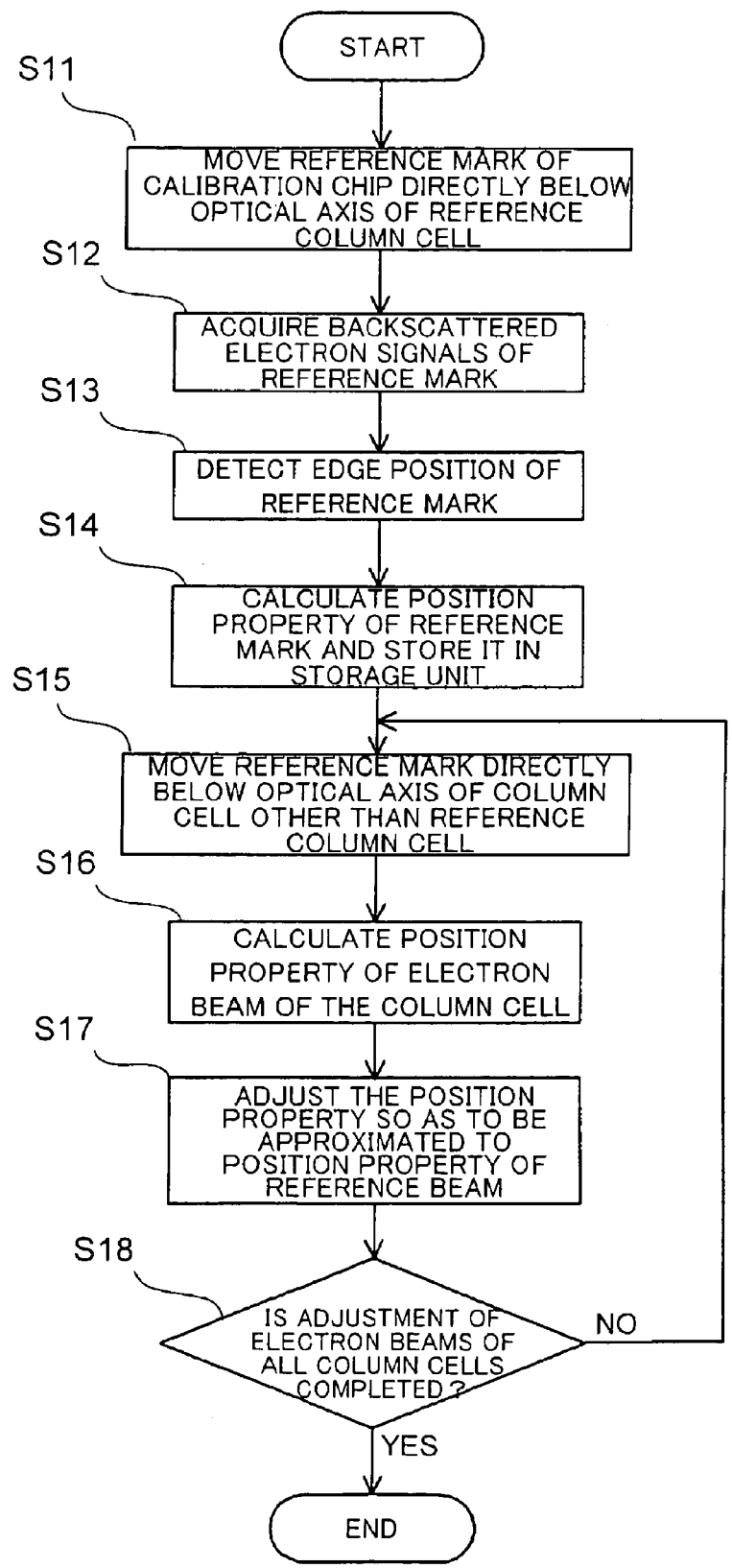
FIG. 8 is a flow chart (No. 1) illustrating a beam property adjustment process in the multi-column exposure apparatus.

FIG. 8 is a flow chart illustrating a beam property adjustment process with the multi-column electron beam exposure apparatus according to the present embodiment. In the present embodiment, description will emphasize on a method for detecting the beam position among the beam properties using the reference mark to adjust the beam position property of each column cell. A reference column cell which irradiates an electron beam serving as a reference beam is determined in advance, and is designated as C1.

First, at Step S11, the calibration chip 41a on the wafer stage 13 is moved to a position directly below the optical axis of the reference column cell C1.

Next, at Step S12, the deflector of the column cell C1 scans the electron beam so that the electron beam can pass on the reference mark, thereby to acquire backscattered electron signals of the reference mark. These backscattered electron signals are acquired by detecting backscattered electrons attributed to the scanned electron beam with a backscattered electron detector.

Next, at Step S13, the edge position is detected from the backscattered electron signals of the reference mark detected at Step S12.

Next, at Step S14, the amount of shift between a position of an actual reference mark and the position of the reference mark obtained by scanning the electron beam is detected. This amount of shift is stored as a reference amount in the storage unit.

Next, at Steps S15 to S17, the properties of the electron beams of the column cells other than the reference column cell are measured, and the properties are adjusted.

At Step S15, the wafer stage is moved so that the reference mark may be located directly below the optical axis of one column cell among the other column cells.

At subsequent Step S16, the beam position property of the electron beam of the one column cell is measured in the same manner as in the case of measurement of the reference beam.

At subsequent Step S17, a difference between the beam position property and the reference beam position property is calculated, and the adjustment coefficient of the voltage applied to the electrostatic deflector is adjusted so that the difference may be a value not more than a predetermined value. The predetermined value is several nm, for example. The adjusted coefficient is stored in the storage unit 35 of each column cell.

At subsequent Step S18, it is determined whether adjustment of the beam position property is completed with respect to the electron beams of all the column cells. When the adjustment for all of the column cells is not completed, the process returns to Step S15, and the beam property adjustment process is repeated.

The exposing process is performed after the above-mentioned beam property adjustment process.

(2) Second Embodiment

In the first embodiment, the properties of the electron beams in all the column cells are measured using one electron-beam-property detecting device for the beam property of the same kind, and are adjusted so as to be approximated to the reference beam properties.

Unlike the first embodiment, in the present embodiment, in order to approximate the electron beam properties of all the column cells to the reference beam properties, multiple electron-beam-property detecting devices are used.

Note that a multi-column electron beam exposure apparatus used in the present embodiment has the same configuration as that of the first embodiment, and therefore description thereof will be omitted.

Hereinafter, description will be given on a method for approximating the electron beam properties of all the column cells to the reference beam properties by using the multiple electron-beam-property detecting devices.

Figure 9:
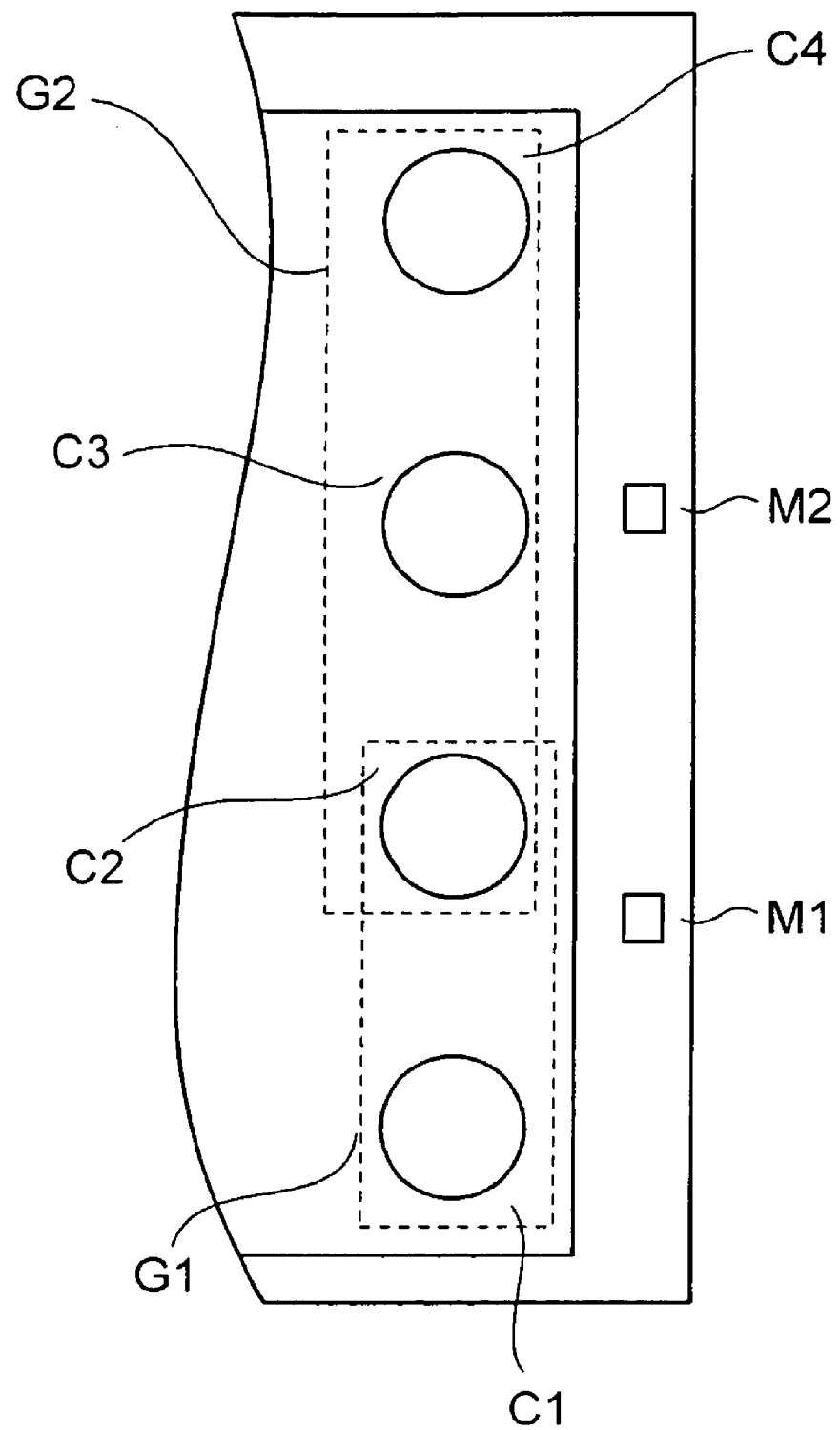
FIG. 9 is a drawing illustrating a multi-column exposure apparatus which uses multiple beam property measuring devices.

FIG. 9 shows some of the column cells when there are multiple (for example, 16) column cells, which is an example of a case where two electron-beam-property detecting devices (M1, M2) are used for four column cells.

The electron-beam-property detecting device M1 measures the beam properties of the electron beams used in the column cells C1 and C2, while the electron-beam-property detecting device M2 measures the beam properties of the electron beams used in the column cells C2, C3, and C4. Moreover, the column cell C1 is set as a reference column cell, and the electron beam used in the column cell C1 is set as a reference beam.

A group of the column cells C1 and C2 is referred to as a column cell group G1, while a group of the column cells C2, C3, and C4 is referred to as a column cell group G2. Thus, the column cell groups G1 and G2 have the column cell C2 in common.

In the column cell group G1, using the electron-beam-property detecting device M1, the beam properties of the electron beam used in the column cell C2 are adjusted so as to be approximated to the reference beam properties, as shown in the first embodiment.

Next, using the electron-beam-property detecting device M2, measurement of the electron beam used in each column cell of the column cell group G2 and adjustment of the beam properties thereof are performed. In the column cell group G2, the beam serving as the reference is the beam of the column cell C2 common to the column cell groups G1 and G2. In the column cell group G1, the column cell C2 is adjusted so as to be approximated to the reference beam of the reference column cell C1. Accordingly, by using the column cell C2 as the reference within the column cell group G2, it is possible to approximate the electron beams of the other column cells to the reference beam.

When a difference in the beam property between the column cell C1 and the column cell C2 is at the maximum value and a difference in the beam property between the column cell C2 and the column cell C3 is at the maximum value, the beam properties of the column cell C3 is twice the allowable error of the reference beam. In other words, when the difference is at the maximum within the column cell group, the error range is enlarged by a product of the number of the electron-beam-property detecting devices and the difference. For this reason, while this value is taken into consideration, the design is made so as to reduce the allowable error range.

The above concrete example is generalized as follows.

A column cell group is designated as Gk where $1 \leq k \leq n$. Reference symbol k denotes order of measuring the beam properties. At this time, a common column cell is included in adjacent column cell groups Gk and Gk+1. Reference symbol n is the number of electron-beam-property detecting devices M, and an electron-beam-property detecting device Mk measures the beam properties of the electron beams used in column cells which the column cell group Gk has.

First, a column cell which uses an electron beam serving as a reference beam is selected, and set as a reference column cell C1. In each column cell within a column cell group G1 including the reference column cell, the beam properties are measured using an electron-beam-property detecting device M1.

As a result of measurement of the beam properties, the electron beam properties of each column cell within the column cell group G1 is adjusted so as to be approximated to those of the reference beam of the column cell C1. This adjustment is performed in the same manner as in the method described in the first embodiment.

Next, in each column cell within a column cell group G2, the beam properties are measured using an electron-beam-property detecting device M2.

A column cell C12 common to the column cell group G1 and the column cell group G2 is adjusted in accordance with the reference beam of the reference column cell C1. When the electron beams of the column cells within the column cell group G2 are adjusted, the common column cell C12 is used as the reference, and the electron beams of the other column cells within the column cell group G2 are adjusted on the basis of the adjusted electron beam.

In this manner, the beam properties are measured in all the electron beams of the column cell group Gk+1 ($1 \leq k \leq n-1$) using an electron-beam-property detecting device Mk+1 ($1 \leq k \leq n-1$), and the beam properties of all the electron beams of the column cell group Gk+1 are adjusted on the basis of the electron beam properties of the common column cell. As a result, the beam properties of all the column cells are within a range of (predetermined error)×n relative to the reference beam of the reference column cell C1.

As described above, in the multi-column electron beam exposure apparatus according to the present embodiment, multiple electron-beam-property detecting devices are used for detection of the beam properties, of the same kind, of the electron beams used in multiple column cells. Each electron-beam-property detecting device detects the beam properties of the electron beams of the column cell group which has a pre-determined number of multiple column cells. The column cell groups have a cell in common, and the beam properties of the electron beams of the other column cells in the column cell group are detected and adjusted on the basis of the beam properties of the electron beam of the common column cell. This makes the beam properties of the electron beams used in all the column cells approximately identical. Thus, even when a pattern extending across the column cells is formed, the beam properties, such as the irradiation position, intensity, and the like of the electron beam, become identical among the column cells. Accordingly, improvement in the connection accuracy of the pattern is possible.

Moreover, since the properties of the electron beams used in multiple column cells are measured using the electron-beam-property detecting device located at a position close to those column cells, the range of the wafer stage moved in order to measure the beam properties can be small. Accordingly, deterioration of moving accuracy of the wafer stage is prevented, and in addition, a large space for the wafer stage movement is not necessary, thereby attaining miniaturization of the apparatus.

Note that, while the description has been made in the present embodiment in which the column cell group has 2 or 3 column cells, the number of the column cells may be 4 or larger. Thereby, the number of times of measurement of the beam properties is reduced while the movement range of the wafer stage is made smaller, and enlargement of the error is reduced.

(Multi-column Electron Beam Exposure Method)

Next, an exposure method in the above-mentioned multi-column electron beam exposure apparatus will be described.

Figure 10:
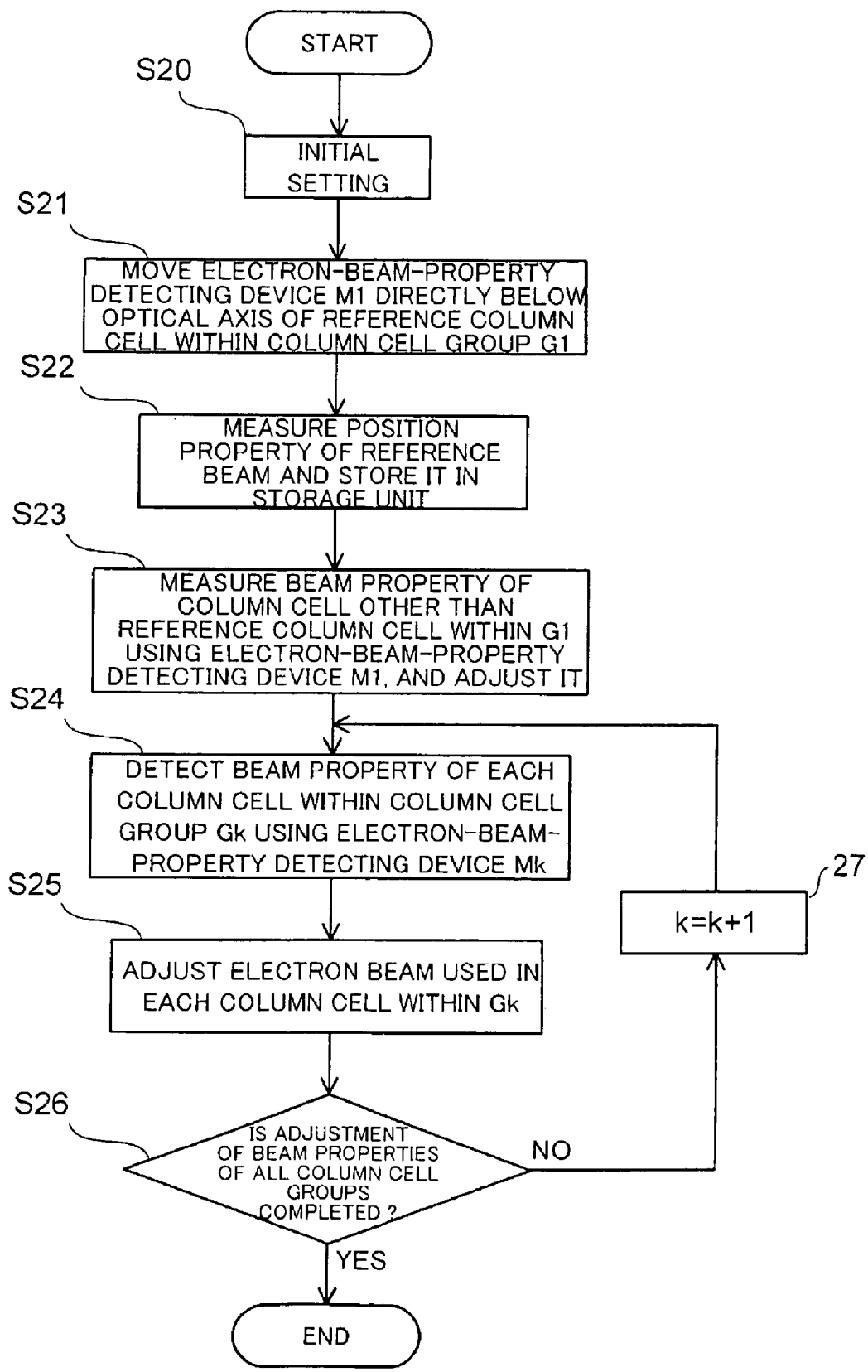
FIG. 10 is a flow chart (No. 2) illustrating a beam property adjustment process in the multi-column exposure apparatus.

FIG. 10 is a flow chart illustrating a beam property adjustment process with the multi-column electron beam exposure apparatus according to the present embodiment. In the present embodiment, description will emphasize on a method for detecting the beam position among the beam properties using the reference mark to adjust the beam property of each column cell.

First, at Step S20, an initial setting is performed. In the initial setting, a reference column cell which irradiates an electron beam used as a reference beam is determined, and column cell groups and electron-beam-property detecting devices used by the column cell groups are determined. Moreover, a column cell group G1 includes the reference column cell, each column cell group is designated as Gk where the initial value of k is set to 2.

At subsequent Step S21, the beam position property of the reference beam is measured and recorded in the storage unit. The beam position property of the reference beam is measured as follows.

The electron-beam-property detecting device M1 on the wafer stage is moved so as to be located directly below the optical axis of the reference column cell C1 of the column cell group G1.

At subsequent Step S22, the deflector of the column cell C1 scans the electron beam so that the electron beam can pass on the reference mark on the electron-beam-property detecting device M1, thereby to acquire backscattered electron signals of the reference mark. These backscattered electron signals are acquired by performing signal processing on backscattered electrons attributed to the scanned electron beam, the backscattered electrons being detected with a backscattered electron detector. Then, the edge position is detected from an image of the detected reference mark. Subsequently, the amount of shift between a position of an actual reference mark and the position of the reference mark obtained by scanning the electron beam is detected. This amount of shift is stored as a reference amount in the storage unit.

Next, at Step S23, the beam property of the electron beam used in each column cell other than the reference column cell within the column cell group G1 is measured using the electron-beam-property detecting device M1, and the electron beam is adjusted so as to be approximated to the property of the reference beam.

Upon measurement of the property and adjustment of the property of the electron beam of the column cell other than the reference column cell, first, the wafer stage is moved so that the reference mark may be located directly below the optical axis of the other column cell. Then, the beam position property of the electron beam of the other column cell is measured in the same manner as in the case of the reference beam.

A difference between the beam position property and the reference beam position property is calculated, and an adjustment coefficient of the voltage applied to the electrostatic deflector is adjusted so that the difference may be a value not more than a predetermined value. The adjusted coefficient is stored in the storage unit 35 of each column cell.

Next, at Step S24, the beam property is detected in the next column cell group Gk using an electron-beam-property detecting device Mk. The beam property of each beam is measured in the same manner as at Step S22. Note that the column cell common to the column cell group Gk and a column cell group Gk−1 is irradiated with the electron beam adjusted to the reference beam property at Step S22.

Next, at Step S25, the electron beams used in the column cells within the column cell group Gk are adjusted on the basis of the beam property of the electron beam used in the column cell common to the column cell group Gk and the column cell group Gk−1.

At subsequent Step S26, it is determined whether adjustment of the beam property is completed in all the column cell groups. When the adjustment is not completed, k is incremented at Step S27. Then, the process returns to Step S24, and the adjustment process is continued.

The exposing process is performed after the above-mentioned beam property adjustment process.

As described above, in the multi-column electron beam exposure method of the present embodiment, the beam property is adjusted in accordance with the reference beam using multiple electron-beam-property detecting devices. Since such multiple electron-beam-property detecting devices are used, the movement range of the wafer stage becomes small compared with the case where only one electron-beam-property detecting device is used. Furthermore, it is possible to prevent deterioration of the moving accuracy and to prevent increase of a spatial area in the movement range for the wafer stage.

What is claimed is:

1. A multi-column electron beam exposure apparatus comprising:
   a plurality of column cells;
   a wafer stage including an electron-beam-property detecting unit for measuring an electron beam property; and
   a controller for measuring beam properties of electron beams used in all the column cells by using the electron-beam-property detecting unit, and for adjusting the electron beams of the respective column cells so that the properties of the electron beams used in the column cells may be approximately identical to one another.

2. The multi-column electron beam exposure apparatus according to claim 1, wherein the electron beam property is any of a beam position, a beam intensity, and a beam shape of the electron beam to be emitted.

3. The multi-column electron beam exposure apparatus according to claim 1, wherein the electron-beam-property detecting unit is any one of a chip for calibration with a reference mark formed thereon and a Faraday cup.

4. The multi-column electron beam exposure apparatus according to claim 1, wherein
   the electron-beam-property detecting unit for measuring the electron beam property of a same kind is singly provided on an edge portion of the wafer stage, and
   using one column cell among the plurality of column cells as a reference column cell, and using an electron beam of the reference column cell as a reference beam, the controller moves the electron-beam-property detecting unit to a predetermined position below each of all the column cells to measure the beam properties of the electron beams of the column cells, and adjusts the electron beam of each column cell other than the reference column cell so that a difference between the property of the electron beam used in the column cell and the property of the reference beam becomes less than a predetermined value.

5. The multi-column electron beam exposure apparatus according to claim 1, comprising:
   n electron-beam-property detecting units Mk ($1 \leq k \leq n$) provided on an edge portion of the wafer stage for measuring the electron beam property of the same kind;
   n column cell groups Gk ($1 \leq k \leq n$) each including a plurality of column cells; and
   at least one column cell common to the column cell group Gk and a column cell group Gk+1, wherein
   using one column cell among the plurality of column cells as the reference column cell, and using the electron-beam-property detecting unit Ml, the controller measures a property of an electron beam used in each column cell within a column cell group G1 including the reference column cell, and adjusts a difference between the property of the electron beam used in each column cell and the beam property of the electron beam used in the reference column cell so that the difference becomes less than a predetermined value, and
   the controller measures a beam property of the electron beam used in each column cell of the column cell group Gk+1 ($1 \leq k \leq n-1$) by using an electron-beam-property detecting unit Mk+1 ($1 \leq k \leq n-1$), and adjusts the beam property on the basis of the electron beam property of the common column cell.

6. The multi-column electron beam exposure apparatus according to claim 5, wherein the controller moves the electron-beam-property detecting units Mk to a predetermined position below each column cell of each of the column cell groups Gk, and measures the beam property.

7. The multi-column electron beam exposure apparatus according to claim 1, wherein the controller adjusts the electron beam property before an exposing process is performed on a wafer which is placed on the wafer stage.

8. The multi-column electron beam exposure apparatus according to claim 1, wherein the controller adjusts the electron beam property at a predetermined time during an exposing process on a specimen being placed on the wafer stage.

9. An exposure method performed by a multi-column electron beam exposure apparatus including a plurality of column cells, the method comprising the steps of:

selecting a column cell serving as a reference among the plurality of column cells;

measuring a beam property of a reference beam by using an electron-beam-property detecting unit for detecting an electron beam property, the reference beam being an electron beam used in the column cell serving as the reference;

measuring a beam property of an electron beam of a column cell other than the reference column cell by using the electron-beam-property detecting unit;

adjusting a difference between the beam property of the reference beam and the beam property of the electron beam other than the reference beam, to be within a predetermined value; and performing an exposing process, using the electron beams of all the column cells, the electron beams having beam properties approximately identical to each other.

10. The multi-column electron beam exposure method according to claim 9, wherein the electron beam property is any of a beam position, a beam intensity, and a beam shape of the electron beam to be emitted.

11. The multi-column electron beam exposure method according to claim 9, wherein the electron-beam-property detecting unit is any one of a chip for calibration with a reference mark formed thereon and a Faraday cup.

* * * * *